(12) United States Patent
Lee et al.

(10) Patent No.: US 9,450,207 B2
(45) Date of Patent: Sep. 20, 2016

(54) ORGANIC LIGHT EMITTING DISPLAY DEVICE AND METHOD FOR MANUFACTURING THE SAME

(71) Applicant: LG DISPLAY CO., LTD., Seoul (KR)

(72) Inventors: Sun hee Lee, Goyang-si (KR); Myung Seop Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/088,649

(22) Filed: Apr. 1, 2016

(65) Prior Publication Data

US 2016/0218322 A1 Jul. 28, 2016

Related U.S. Application Data

(62) Division of application No. 14/317,395, filed on Jun. 27, 2014, now Pat. No. 9,337,444.

(30) Foreign Application Priority Data

Jun. 28, 2013 (KR) ........................ 10-2013-0075292

(51) Int. Cl.
*H01L 21/00* (2006.01)
*H01L 51/52* (2006.01)
*H01L 51/56* (2006.01)
*H01L 27/32* (2006.01)

(52) U.S. Cl.
CPC ....... *H01L 51/5259* (2013.01); *H01L 27/3244* (2013.01); *H01L 51/56* (2013.01); *H01L 2227/323* (2013.01)

(58) Field of Classification Search
USPC ............... 438/26, 28, 30; 257/E33.056, 40
See application file for complete search history.

(56) References Cited

U.S. PATENT DOCUMENTS

| | | | |
|---|---|---|---|
| 7,221,095 B2 | 5/2007 | Yamazaki et al. |
| 7,579,774 B2 | 8/2009 | Yamazaki et al. |
| 8,035,583 B2 | 10/2011 | Koyama |
| 8,508,439 B2 | 8/2013 | Koyama |
| 8,531,764 B2 | 9/2013 | Park |
| 8,609,181 B2 | 12/2013 | Yamazaki et al. |
| 2005/0012454 A1 | 1/2005 | Yamazaki et al. |
| 2007/0085783 A1 | 4/2007 | Koyama |
| 2007/0205718 A1 | 9/2007 | Yamazaki et al. |
| 2009/0015760 A1 | 1/2009 | Hattori et al. |
| 2009/0286445 A1 | 11/2009 | Yamazaki et al. |
| 2012/0092236 A1 | 4/2012 | Koyama |
| 2012/0326590 A1 | 12/2012 | Park |

*Primary Examiner* — Telly Green
(74) *Attorney, Agent, or Firm* — Dentons US LLP

(57) ABSTRACT

Disclosed is an organic light emitting display device in which water is prevented from externally permeating thereinto. The organic light emitting display device comprises a first substrate on which an organic light emitting diode and a driving device designed to drive the organic light emitting diode are formed; a second substrate facing the first substrate; a viscosity layer interposed between the first substrate and the second substrate to cover entire areas of the first substrate and the second substrate, the viscosity layer including a filler capable of water absorption; and a first adhesion layer arranged to adhere the viscosity layer to the first substrate, wherein the viscosity layer is a material including a cross-linkage functional group and having a viscosity characteristic at room temperature.

20 Claims, 11 Drawing Sheets

Related Art

FIG. 8C ably be affected by bending of the second substrate 2, whereby a defect may occur in the organic light emitting display device 10.

ORGANIC LIGHT EMITTING DISPLAY DEVICE AND METHOD FOR MANUFACTURING THE SAME

CROSS REFERENCE TO RELATED APPLICATIONS

This application is a divisional application, and claims the benefit of U.S. patent application Ser. No. 14/317,395 filed Jun. 27, 2014, now allowed, and Korean Patent Application No. 10-2013-0075292 filed on Jun. 28, 2013, both of which are hereby incorporated by reference for all purposes as if fully set forth herein.

BACKGROUND OF THE INVENTION

1. Field of the Invention

The present invention relates to an organic light emitting display device and a method for manufacturing the same.

2. Discussion of the Related Art

With the development of multimedia, importance of a flat panel display (FPD) has been increased, whereby various types of flat panel displays such as a liquid crystal display (LCD), a field emission display (FED), and an organic light emitting display device (OLED) have been commercialized.

Of the various types of flat panel displays, the organic light emitting display device is a self-light-emitting device that does not require a back light unit, unlike a liquid crystal display which is not a self-light-emitting device. As a result, the organic light emitting display device has received much attention as a display device that may substitute for the liquid crystal display, owning to advantages of lightweight and thin type, excellent viewing angle, excellent contrast ratio, low power consumption, and fast response speed.

If the organic light emitting display device is exposed to water, its electrode may be damaged, whereby a problem occurs in that a pixel region is not emitted. Accordingly, an encapsulation technique is generally used to prevent water from being externally permeated into the organic light emitting display device. Hereinafter, an organic light emitting display device, to which an encapsulation technique according to the related art is applied, will be described with reference to FIGS. 1A and 1B.

Figure 1A:
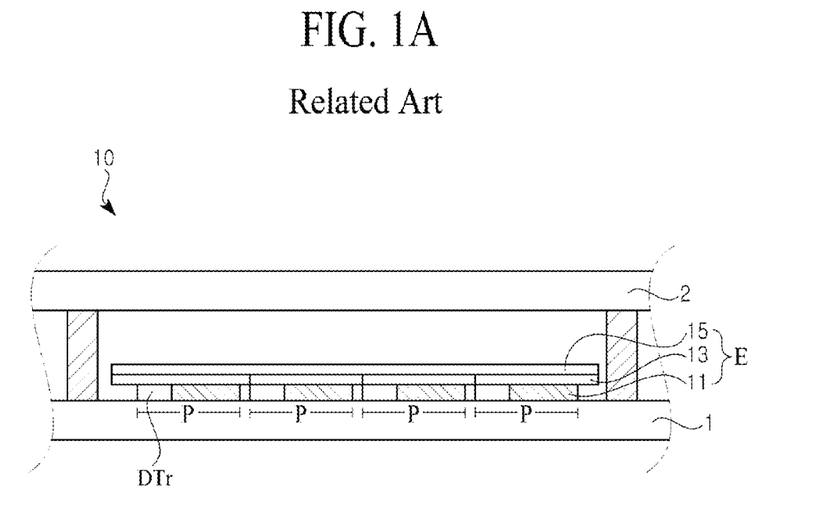
FIGS. 1A and 1B are cross-sectional views briefly illustrating an organic light emitting display device, to which an encapsulation technique according to the related art is applied.

FIG. 1A is a cross-sectional view briefly illustrating an organic light emitting display device to which an encapsulation technique according to the related art is applied.

The organic light emitting display device 10 shown in FIG. 1A includes a first substrate 1 and a second substrate 2 facing the first substrate 1, wherein the first and second substrates 1 and 2 are spaced apart from each other, and their edge portions are sealed through a sealing member 20 and bonded to each other.

In more detail, a driving thin film transistor DTr is formed on the first substrate 1 for each pixel region P, and a first electrode 11, an organic light emitting layer 13, and a second electrode 15, which constitute an organic light emitting diode E, are sequentially formed on the first substrate 1. The first electrode 11 is electrically connected with the driving thin film transistor DTr. In case of the organic light emitting display device shown in FIG. 1A, since the first substrate 1 and the second substrate 2 are sealed by the sealing member 20, water is prevented from being externally permeated thereinto.

However, in a case of the organic light emitting display device shown in FIG. 1A, since a portion between the first substrate 1 and the second substrate 2 is empty and the first and second substrates 1 and 2 are bonded to each other by the sealing member 20 only, the sealing member 20 may be damaged by external impact or the first substrate 1 may adversely be affected by bending of the second substrate 2, whereby a defect may occur in the organic light emitting display device 10.

Figure 1B:
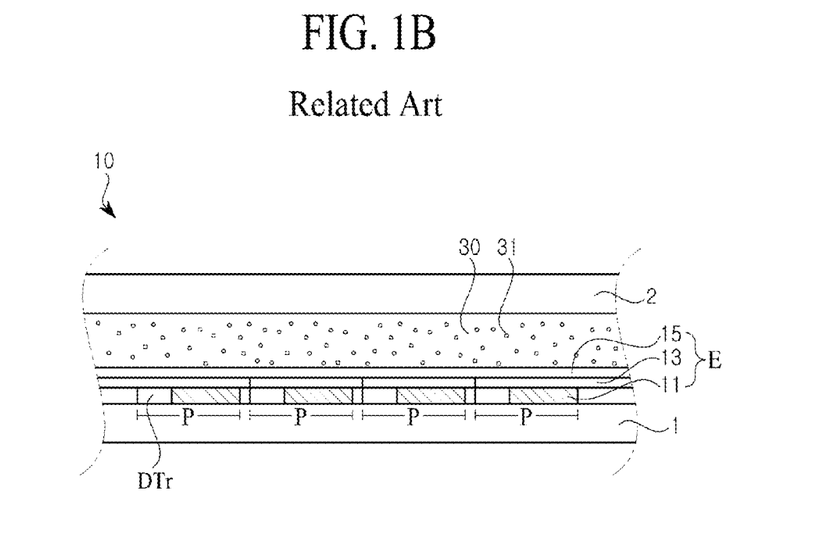

FIG. 1B is a cross-sectional view briefly illustrating another organic light emitting display device to which an encapsulation technique according to another related art is applied. The organic light emitting display device 10 shown in FIG. 1B includes a first substrate 1 and a second substrate 2 facing the first substrate 1, and a hardening resin 30 is deposited on an entire surface of the first substrate 1. The hardening resin 30 contains a water absorbent 31 for water absorption, The first and second substrates 1 and 2 are completely bonded to each other by the hardening resin 30. In this way, in the organic light emitting display device shown in FIG. 1B, since the hardening resin 30 is deposited on the entire surface of the first substrate 1, water may be prevented from being in the organic light emitting display device 10. Also, since a space between the first substrate 1 and the second substrate 2 is fully filled with the hardening resin 30, the first substrate 1 or the second substrate is not damaged easily even though external force or impact is given to the organic light emitting display device 10.

However, in case of the organic light emitting display device shown in FIG. 1B, if the water absorbent 31 contained in the hardening resin 30 absorbs water, its volume is increased as much as 1.5 times to 2 times, and the water absorbent 31 of which volume is increased increases stress to the hardening resin 30, whereby adhesion with the first substrate 1 or the second substrate 2 is deteriorated.

Figure 2A:
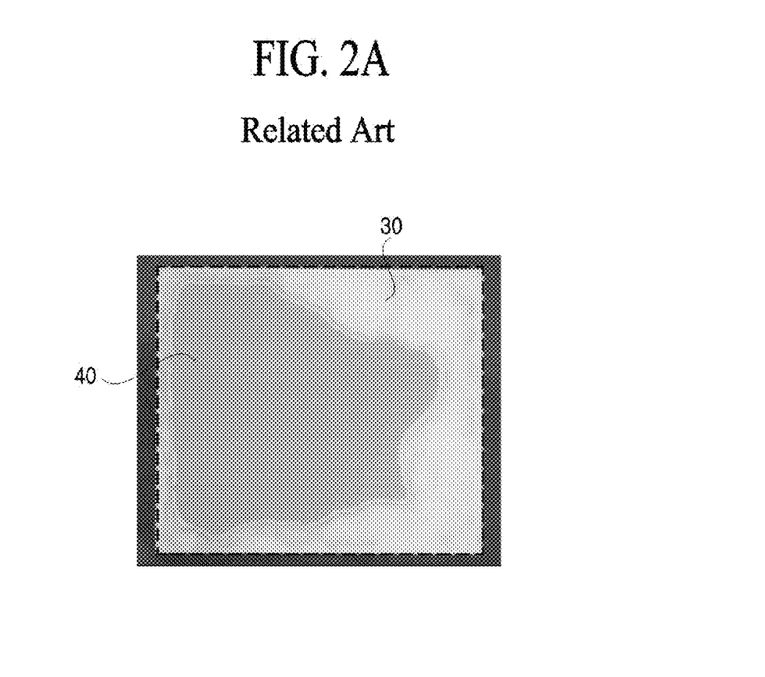
FIGS. 2A and 2B are views illustrating a gap between a first substrate and a hardening resin and between a second substrate and the hardening resin.
Figure 2B:
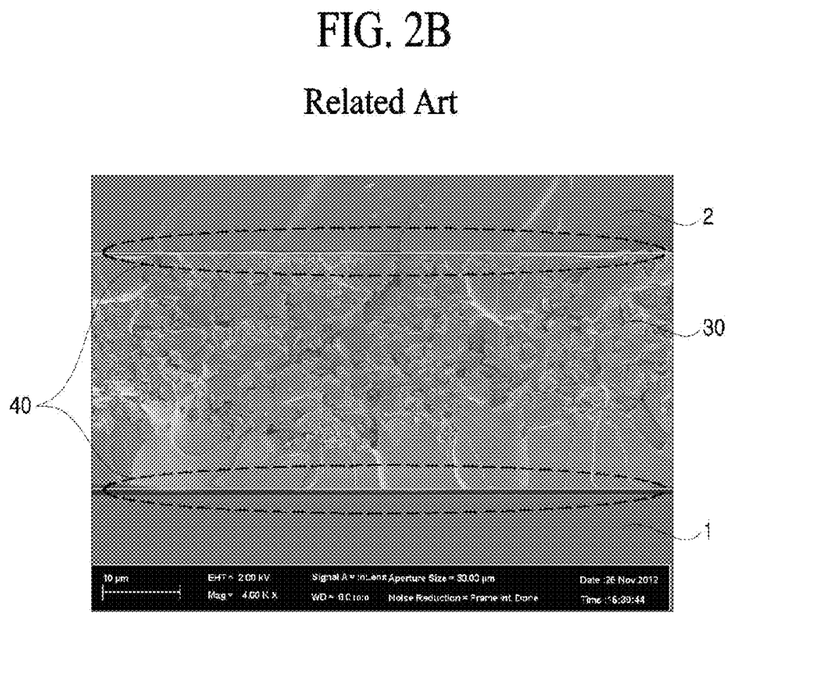
Figure 2C:
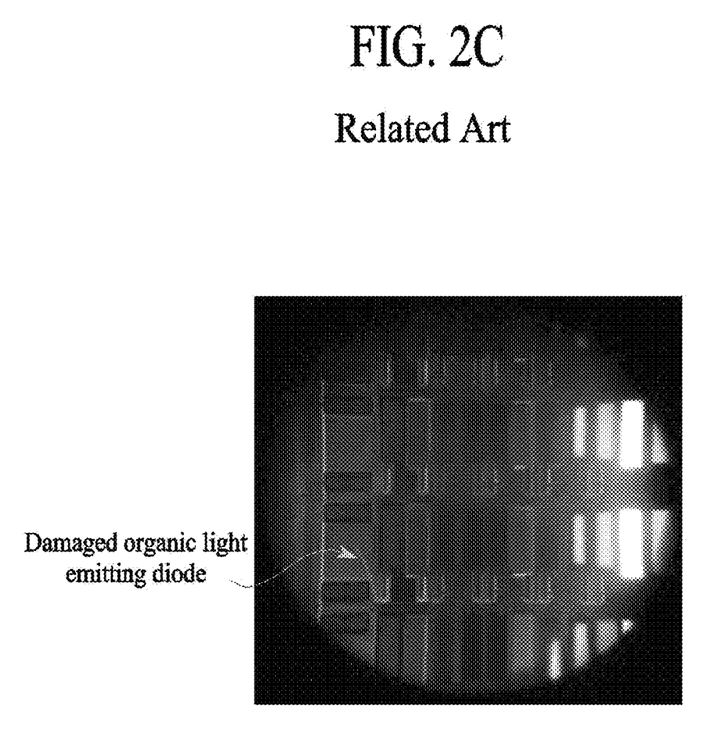
FIG. 2C is a view illustrating an organic light emitting display device damaged due to water permeation caused by a gap.

For this reason, as shown in FIGS. 2A and 2B, a gap 200 between the first substrate 1 and the hardening resin 30 and between the second substrate 2 and the hardening resin 30 occurs. Particularly, separation of the hardening resin 30 from the first substrate occurs due to the gap between the first substrate 1 and the hardening resin 30, whereby a problem occurs in that the organic light emitting diode is damaged as shown in FIG. 2C. As a result, a problem occurs in that water may be permeated into the organic light emitting display device through the damaged area.

SUMMARY OF THE INVENTION

Accordingly, the present invention is directed to an organic light emitting display device and a method for manufacturing the same, which substantially obviate one or more problems due to limitations and disadvantages of the related art.

An advantage of the present invention is to provide an organic light emitting display device in which water may be prevented from being externally permeated, and a method for manufacturing the same.

Another advantage of the present invention is to provide an organic light emitting display device that may prevent separation, which is caused by absorption of water externally permeated thereinto, from occurring, and a method for manufacturing the same.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, an organic light emitting display device according to one aspect of the present invention comprises a first substrate on which an organic light emitting diode and a driving device designed to drive the organic light emitting diode are formed; a second substrate facing the first substrate; a viscosity layer interposed between the first substrate and the second substrate to cover entire areas of the first substrate and the second substrate, the viscosity layer including a filler capable of water absorption; and a first adhesion layer arranged to adhere the viscosity layer to the first substrate, wherein the viscosity layer is a material including a cross-linkage functional group and having a viscosity characteristic at room temperature.

In another aspect of the present invention, a method for manufacturing an organic light emitting display device comprises providing a first substrate and a second substrate facing each other, wherein the first substrate includes an organic light emitting diode and a driving device designed to drive the organic light-emitting diode formed thereon; adhering a viscosity layer, which includes a filler capable of water absorption and has a viscosity characteristic at room temperature with a cross-linkage functional group, to a first adhesion layer; adhering the viscosity layer to a second substrate; and bonding the first substrate and the second substrate to each other by adhering the first adhesion layer to the first substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Meanwhile, terminologies disclosed in this specification should be understood as follows.

It is to be understood that the singular expression used in this specification includes the plural expression unless defined differently on the context. The terminologies such as "first" and "second" are intended to identify one element from another element, and it is to be understood that the scope of the present invention should not be limited by these terminologies.

Also, it is to be understood that the terminologies such as "include" and "has" are intended so as not to exclude the presence or optional possibility of one or more features, numbers, steps, operations, elements, parts or their combination.

When some structure is formed "on" and "below" another structure, it is to be understood that the disclosure includes that these structures are in contact with each other and that a third structure is interposed between the above structures. However, when the terminology "directly on" or "directly below" is used, it is to be understood to be limited that these structures are in contact with each other.

Hereinafter, the embodiments of the present invention will be described in detail with reference to the accompanying drawings.

Organic Light Emitting Display Device

Generally, an organic light emitting display device may be divided into a top emission type organic light emitting display device and a bottom emission type organic light emitting display device based on a transmissive direction of emitted light. Hereinafter, for convenience of description, it is assumed that the organic light emitting display device according to the present invention is the bottom emission type organic light emitting display device. However, main features of the present invention, which will be described later, may equally be applied to the top emission type organic light emitting display device.

First Embodiment

Figure 3:
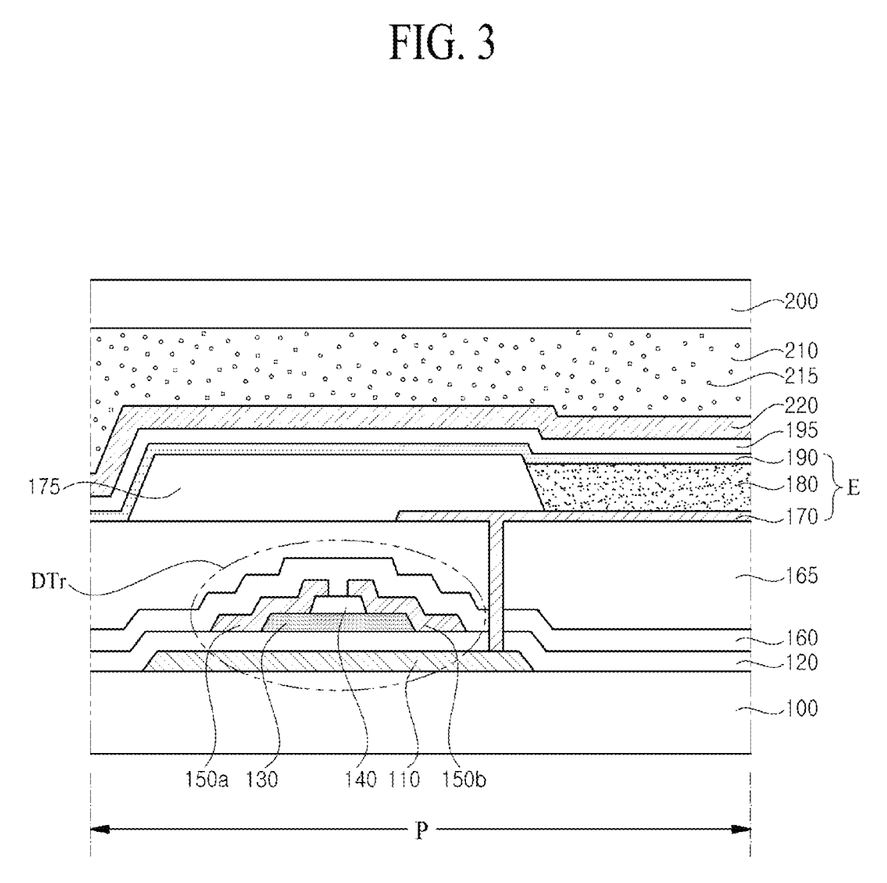
FIG. 3 is a cross-sectional view briefly illustrating an organic light emitting display device according to the first embodiment of the present invention.

FIG. 3 is a cross-sectional view briefly illustrating an organic light emitting display device according to the first embodiment of the present invention.

As shown in FIG. 3, the organic light emitting display device according to the first embodiment of the present invention includes a first substrate 100, a second substrate 200, a viscosity layer 210, and a first adhesion layer 220.

An organic light emitting diode E and a driving device DTr for driving the organic light emitting diode E are formed on the first substrate 100. In one embodiment, the driving device may be implemented using one or more thin film transistors TFTs. One pixel P may be defined by a combination of the organic light emitting diode E and the driving device DTr.

Hereinafter, the thin film transistor constituting the driving device DTr and the organic light emitting diode E will be described in more detail.

As shown in FIG. 3, the driving device DTr includes a gate electrode 110, an active layer 130, an etch stopper 140, a source electrode 150a, and a drain electrode 150b. The organic light emitting diode E includes a first electrode 170, an organic light emitting layer 180, and a second electrode 190.

In more detail, the organic light emitting display device according to the first embodiment of the present invention includes a first substrate 100, a gate electrode 110, a gate insulating film 120, an active layer 130, an etch stopper 140, a source electrode 150a, a drain electrode 150b, a first passivation layer 160, a planarization layer 165, a first electrode 170, a bank layer 175, an organic light emitting layer 180, a second electrode 190, and a second passivation layer 195.

Although glass is mainly used as the first substrate 100, transparent plastic which may be bent or flexible, for example, polyimide may be used as the first substrate 100. If polyimide is used as a material of the first substrate 100, polyimide having excellent heat-resistance, which may be tolerable at high temperature, may be used considering that a deposition process of high temperature is performed on the first substrate 100.

The gate electrode 110 is patterned on the first substrate 100. The gate electrode 110 may be made of Mo, Al, Cr, Au, Ti, Ni, Nd, Cu, or their alloy, and may be made of a single layer or two or more multiple layers of the above metals or alloy.

The gate insulating film 120 is formed on the gate electrode 110 to insulate the gate electrode 110 from the active layer 130. The gate insulating film 120 may be made of, but not limited to, an inorganic insulating material such as silicon oxide or silicon nitride. The gate insulating film 120 may be made of an organic insulating material such as photo acryl or Benzocyclobutene (BCB).

The active layer 130 is patterned on the gate insulating film 120. The active layer 130 is formed to overlap the gate electrode 110. The active layer 130 may be made of, but not limited to, an oxide semiconductor such as In—Ga—Zn—O (IGZO). The active layer 130 may be made of a silicon based semiconductor.

The etch stopper 140 is patterned on the active layer 130. The etch stopper 140 serves to prevent a channel region of the active layer 130 from being etched during an etching process for patterning the source electrode 150a and the drain electrode 150b. The etch stopper 140 may be made of, but not limited to an inorganic insulating material such as silicon oxide or silicon nitride. The etch stopper 140 may be omitted as the case may be.

The source electrode 150a and the drain electrode 150b are patterned on the etch stopper 140 while facing each other. The source electrode 150a is extended towards one side of the active layer 130 and connected with the active layer 130. The drain electrode 150b is extended towards the other side of the active layer 130 and connected with the active layer 130. The source electrode 150a and the drain electrode 150b may be made of Mo, Al, Cr, Au, Ti, Ni, Nd, Cu, or their alloy, and may be made of a single layer or two or more multiple layers of the above metals or alloy.

The first passivation layer 160 is formed on the source electrode 150a and the drain electrode 150b. The first passivation layer 160 may be made of, but not limited to, an inorganic insulating material such as silicon oxide or silicon nitride. The first passivation layer 160 may be made of an organic insulating material such as photo acryl or Benzocyclobutene (BCB).

The planarization layer 165 is formed on the first passivation layer 160 and serves to reduce surface step difference of the organic light emitting display device. Such a planarization layer 165 may be made of an organic insulating material such as photo acryl or Benzocyclobutene (BCB).

The first electrode 170 is patterned on the planarization layer 165. The first electrode 170 is connected with the drain electrode 150b through a contact hole provided in the planarization layer 165 and the first passivation layer 160. Since the organic light emitting display device according to the present invention is the bottom emission type, the first electrode 170 may be formed of a transparent conductive material having a relatively high work function value to serve as an anode, for example, indium tin oxide (ITO) or indium zinc oxide (IZO).

The bank layer 175 is patterned on the planarization layer 165. In more detail, the bank layer 175 is patterned to overlap the driving device DTr, and an organic light emitting diode region where the organic light emitting diode is formed is defined by the bank layer 175. The bank layer 175 may be made of, but not limited to, an organic insulating material, for example, polyimide, photo acryl or Benzocyclobutene (BCB).

The organic light emitting layer 180 is formed on the first electrode 170. Although not shown, the organic light emitting layer 180 may be formed in such a manner that a hole injecting layer, a hole transporting layer, an light emitting layer, an electron transporting layer, and an electron injecting layer are sequentially deposited. However, one layer or two or more layers of the hole injecting layer, the hole transporting layer, the electron transporting layer, and the electron injecting layer may be omitted. The organic light emitting layer 180 may be formed to emit the same color for each pixel, for example, white (W) light, or may be formed to emit respective color different for each pixel, for example, red, green, blue, or white light.

The second electrode 190 is formed on the organic light emitting layer 180. The second electrode 190 may be formed in a type of an electrode common for all the pixels without being varied for each pixel. In other words, the second electrode 190 may be formed on the bank layer 175 as well as the organic light emitting layer 180. Since the organic light emitting display device according to the present invention is the bottom emission type, the second electrode 190 may be formed of an opaque conductive material to serve as a cathode electrode. For example, the second electrode 190 may be formed of any one selected from Al, AlNd, Ag, Mg, Au, and AlMg, which are metal materials having a relatively lower work function value than that of the first electrode 170.

The second passivation layer 195 is formed on the second electrode 190 to encompass the driving device DTR and the organic light emitting diode E. The second passivation layer 195 serves to prevent external moisture from being permeated into the organic light emitting display device, thereby passivating the driving device DTR and the organic light emitting diode E formed on the first substrate 100. In one embodiment, the second passivation layer 195 may be made of, but not limited to, an inorganic insulating material such as silicon oxide or silicon nitride. The second passivation layer 195 may be made of an organic insulating material such as photo acryl or Benzocyclobutene (BCB).

The driving device DTr shown in FIG. 3 is only exemplary and may be formed in various structures. For example, although the driving device DTr of FIG. 3 has a bottom gate structure in which the gate electrode 110 exists below the active layer 130, the driving device DTr may have a top gate structure in which the gate electrode 110 exists above the active layer 130 in a modified embodiment.

Referring to FIG. 3 again, the second substrate 200 is bonded to the first substrate 100 to face with each other, thereby encapsulating the organic light emitting display device.

In one embodiment, the second substrate 200 may be formed of a metal material including Mg. In the present invention, the second substrate 200 is formed of a metal material including Mg because Mg may serve to radiate heat due to its good heat conductivity. In this way, since the second substrate 200 is formed of a metal material including Mg in the present invention, a radiator such as fan or heat pipe is not required for radiation of the organic light emitting display device, whereby the lightweight and thin organic light emitting display device may be obtained more easily.

According to this embodiment, a metal oxide layer (not shown) may be formed on one surface of the second substrate 200. This metal oxide layer may insulate the second substrate 200 from the outside and at the same time uniformly oxidize the second substrate 200 formed of Mg. At this time, the metal oxide layer may be formed by anodizing one surface of the second substrate 200. In this case, anodizing is a kind of plating method, and is to oxidize one surface of the second substrate 200 through oxygen generated at the anode by conducting the second substrate with the anode in a state that one surface of the second substrate 200 is immersed in an electrolyte solution.

In the present invention, since the second substrate 200 is formed using Mg at a predetermined thickness, the second substrate 200 is not oxidized entirely and the surface of the second substrate 200 is only changed to MgO, whereby the metal oxide layer is formed on one surface of the second substrate 200.

As described above, since the second substrate 200 is formed using Mg having excellent heat conductivity in the present invention, radiation characteristic of the organic light emitting display device may be improved even though a separate radiator is not required, whereby the lightweight and thin organic light emitting display device may be obtained more easily.

Referring to FIG. 3, again, the viscosity layer 210 and the first adhesion layer 220 are interposed entirely between the first substrate 100 and the second substrate 200, whereby the first substrate 100 and the second substrate 200 are bonded to each other. Hereinafter, the viscosity layer 210 and the first adhesion layer 220 will be described in more detail.

The viscosity layer 210 is interposed between the second substrate 200 and the first adhesion layer 220 to cover the entire areas of the first substrate 100 and the second substrate 200. At this time, a filler 215 for absorbing water which is externally permeated is included in the viscosity layer 210.

The viscosity layer 210 according to the present invention may be formed of a material having a cross-linkage functional group and viscosity characteristic at room temperature. If the filler 215 absorbs water, its volume is increased as much as 1.5 times to 2 times. Since the viscosity layer 20 cannot endure stress due to the increase of volume of the filler 215, if the viscosity layer 210 is formed of a material having no viscosity characteristic at room temperature without a cross-linkage functional group, the viscosity layer 210 is formed of the material having a cross-linkage functional group and viscosity characteristic at room temperature. Accordingly, in case of the present invention, the viscosity layer 210 is formed of the material having a viscosity characteristic at room temperature with a cross-linkage functional group, whereby the viscosity layer 210 may endure stress caused by increase of volume of the filler 215 due to water absorption.

To this end, the viscosity layer 210 may be formed of a material having storage elastic modulus of 0.001 MPa to 100 MPa in the temperature range of 20° C. to 120° C. or a material having a glass transition temperature Tg of −70° C. to 10° C. This is because that viscosity characteristic may be deteriorated if the storage elastic modulus is greater than 100 MPa, it is difficult for the viscosity layer 210 to be maintained at a fixing state if the storage elastic modulus is lower than 0.001 MPa, and the viscosity layer 210 cannot have viscosity characteristic at room temperature if the glass transition temperature Tg is lower than −70° C. or higher than 10° C.

In one embodiment, the viscosity layer 210 may be formed using a polyolefin based material or polyolefin based polymer, such as Polyethylene (PE), Polypropylene (PP), Ethylene vinylacetate (EVA), and Ethylene-Ethylacrylate (EEA). This is because that the polyolefin based material has excellent water resistance according to hydrophobic (non-polar) characteristic.

For another example, the viscosity layer 210 may be formed using Polyimide (PI), Polyamide (PA), Polyvinyl Chloride (PVC), or acrylic polymer material.

The viscosity layer 210 may be formed to have a thickness of 5 μm to 100 μm. This is because it is difficult for the viscosity layer 210 to include the filter 215 if the thickness of the viscosity layer 210 is thinner than 5 μm, thereby lowering efficiency of water absorption, and the thickness of the organic light emitting display device may become thick if the thickness of the viscosity layer 210 is thicker than 100 μm.

The filler 215 is included in viscosity layer 210 and serves to absorb water. Any material having an ingredient, which may absorb or remove water or moisture externally flown through a physical or chemical reaction, may be used as the filler 215. In one embodiment, the filler 215 may be a water reactive absorbent that absorbs water or moisture by being chemically reactive with moisture, water, or oxygen flown into the viscosity layer 210.

The water reactive absorbent may be made of a single or two or more mixtures of metal powder such as alumina, metal oxide, metallic salt, or $P_2O_5$, and the physical absorbent may be made using silica, zeolite, titania, zirconia, or montmorillonite. In one embodiment, detailed examples of the metal oxide constituting the water reactive absorbent may include, but are not limited to, $Li_2O$, $Na_2O$, BaO, CaO and MgO, and examples of the metallic salt may include, but are not limited to, sulphate such as $Li_2SO_4$, $Na_2SO_4$, $CaSO_4$, $MgSO_4$, $CoSO_4$, $Ga_2(SO_4)_3$, $Ti(SO_4)_2$, or $NiSO_4$, metal halide such as $CaCl_2$, $MgCl_2$, $SrCl_2$, $YCl_3$, $CuCl_2$, CsF, $TaF_5$, $NbF_5$, LiBr, $CaBr_2$, $CeBr_3$, $SeBr_2$, VBr3, $MgBr_2$, $BaI_2$, or $MgI_2$, or metal chlorate such as $Ba(ClO_2)_2$ or $Mg(ClO_4)_2$.

Although the filler 215 is a water reactive absorbent in the aforementioned embodiment, the filler 215 may also be a physical absorbent, which reduces external permeation of water or moisture by making a moving path of water or moisture be long, in a modified embodiment.

In one embodiment, the content of the filler 215 may be 10% to 100% by weight. This is because the water absorption efficiency is deteriorated if the content of the filler 215 is less than 10% by weight.

The first adhesion layer 220 is intended to adhere the viscosity layer 210 to the first substrate 100. In one embodiment, the first adhesion layer 220 may be formed of a hardening resin that includes a hardening functional group. At this time, the hardening resin may be a thermohardening resin, an optical hardening resin, or a dual hardening resin, and the hardening functional group may be one or more of an isocyanate group, a hydroxyl group, a carboxyl group, an amide group, an epoxide group, a cyclic ether group, a sulfide group, an acetal group, and a lactone group.

The first adhesion layer 220 may be formed to have a thickness of 2 µm to 20 µm. This is because that adhesion may be deteriorated if the thickness of the first adhesion layer 220 is thinner than 2 µm and the thickness of the organic light emitting display device may become thick if the thickness of the first adhesion layer 220 is thicker than 20 µm.

In one embodiment, the first adhesion layer 220 may also include the filler 215 to more perfectly prevent external water permeation from occurring. In this case, since the first adhesion layer 220 includes the hardening functional group, the first adhesion layer 220 cannot endure stress caused by increase of volume of the filler 215 due to water absorption of the filler 215, whereby a gap may be generated. Since this gap is generated when the content of the filler 215 is 20% or more, the first adhesion layer 220 according to the present invention preferably includes the filler 215 of which content is less than 20%.

In the aforementioned embodiment, the viscosity layer 210 is formed to have the thickness of 5 µm to 100 µm and the first adhesion layer 220 is formed to have the thickness of 2 µm to 20 µm. However, in the modified embodiment, the first adhesion layer 220 and the viscosity layer 210 may be formed such that a thickness rate of the first adhesion layer 220 and the viscosity layer 210 is 0.1 to 1.5 without limitation to the above thickness.

If the viscosity layer 210 is only used for the organic light emitting display device, bubbles are captured in step differences caused by elements formed on the first substrate 100, whereby adhesion characteristic may be deteriorated and the viscosity layer 210 may be fixed by the first adhesion layer 220. For this reason, a double layer structure of the viscosity layer 210 and the first adhesion layer 220 may be used for the organic light emitting display device according to the present invention.

As described above, in the organic light emitting display device according to the present invention, since the filler 215 for water absorption is included in the viscosity layer 210 formed of the material having viscosity characteristic at room temperature with a cross-linkage functional group and the viscosity layer 210 is interposed entirely between the first substrate 100 and the second substrate 200, it is possible to prevent water from being externally permeated into the organic light emitting display device. Even though the volume of the filler is increased due to water absorption, the viscosity layer 210 may endure stress caused by an increase of the volume of the filler, whereby separation between the viscosity layer 210 and the first substrate 100 and between the viscosity layer 210 and the second substrate 200 may be prevented from occurring.

Also, since separation between the first substrate 100 and the viscosity layer 210 and between the second substrate 200 and the viscosity layer 210 may be prevented from occurring, water permeation caused by separation may be shielded, and the organic light emitting diode E and the second passivation layer 195, which passivates the organic light emitting diode E, may be prevented from being damaged.

Second Embodiment

Figure 4:
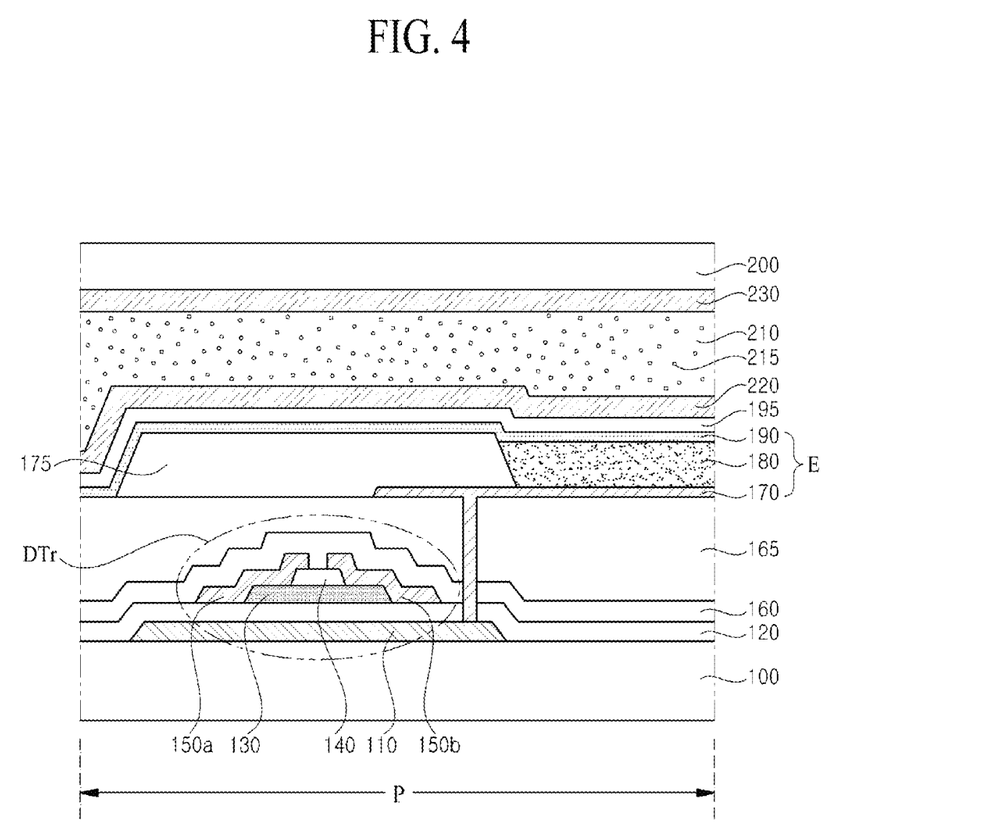
FIG. 4 is a cross-sectional view briefly illustrating an organic light emitting display device according to the second embodiment of the present invention.

FIG. 4 is a cross-sectional view briefly illustrating an organic light emitting display device according to the second embodiment of the present invention.

As shown in FIG. 4, the organic light emitting display device according to the second embodiment of the present invention includes a first substrate 100, a second substrate 200, a viscosity layer 210, a first adhesion layer 220, and a second adhesion layer 230.

Since the organic light emitting display device according to the second embodiment is the same as that according to the first embodiment except that it further includes the second adhesion layer 230, detailed description of the other elements except for the second adhesion layer 230 will be omitted. Hereinafter, only the second adhesion layer 230 will be described in detail.

The second adhesion layer 230 is intended to adhere the viscosity layer 210 to the second substrate 200, and is formed to cover the entire area of the second substrate 200.

In one embodiment, the second adhesion layer 230 may be formed of a hardening resin that includes a hardening functional group. At this time, the hardening resin may be a thermohardening resin, an optical hardening resin, or a dual hardening resin, and the hardening functional group may be one or more of an isocyanate group, a hydroxyl group, a carboxyl group, an amide group, an epoxide group, a cyclic ether group, a sulfide group, an acetal group, and a lactone group.

This second adhesion layer 230 may be formed to have a thickness of 2 µm to 20 µm. This is because that adhesion may be deteriorated if the thickness of the second adhesion layer 230 is thinner than 2 µm, and the thickness of the organic light emitting display device may become thicker if the thickness of the second adhesion layer 230 is thicker than 20 µm. In the modified embodiment, the second adhesion layer 230 may be formed such that a thickness of the second adhesion layer 230 and the viscosity layer 210 is 0.1 to 1.5.

In one embodiment, the second adhesion layer 230 may also include a filler 215 to more perfectly prevent external water permeation from occurring. In this case, since the second adhesion layer 230 includes the hardening functional group, the second adhesion layer 230 cannot endure stress caused by increase of volume of the filler 215 due to water absorption of the filler 215, whereby a gap may be generated. Since this gap is generated when the content of the filler 215 is 20% or more, the second adhesion layer 230 according to the present invention preferably includes the filler 215 of which content is less than 20%.

As described above, since the organic light emitting display device according to the second embodiment of the present invention includes the second adhesion layer 230 for adhering the viscosity layer 220 to the second substrate 200, adhesion between the viscosity layer 220 and the second substrate 200 may be more improved than that in the organic light emitting display device according to the first embodiment.

As a result, separation between the second substrate 200 and the viscosity layer 210 may more effectively be prevented from occurring, whereby water permeation caused by separation may be shielded more perfectly.

Third and Fourth Embodiments

The aforementioned organic light emitting display device according to the first and second embodiments includes the second passivation layer 195 for passivating the organic light emitting diode E and the driving device DTr by preventing external moisture from being permeated into the organic light emitting display device.

Figure 5:
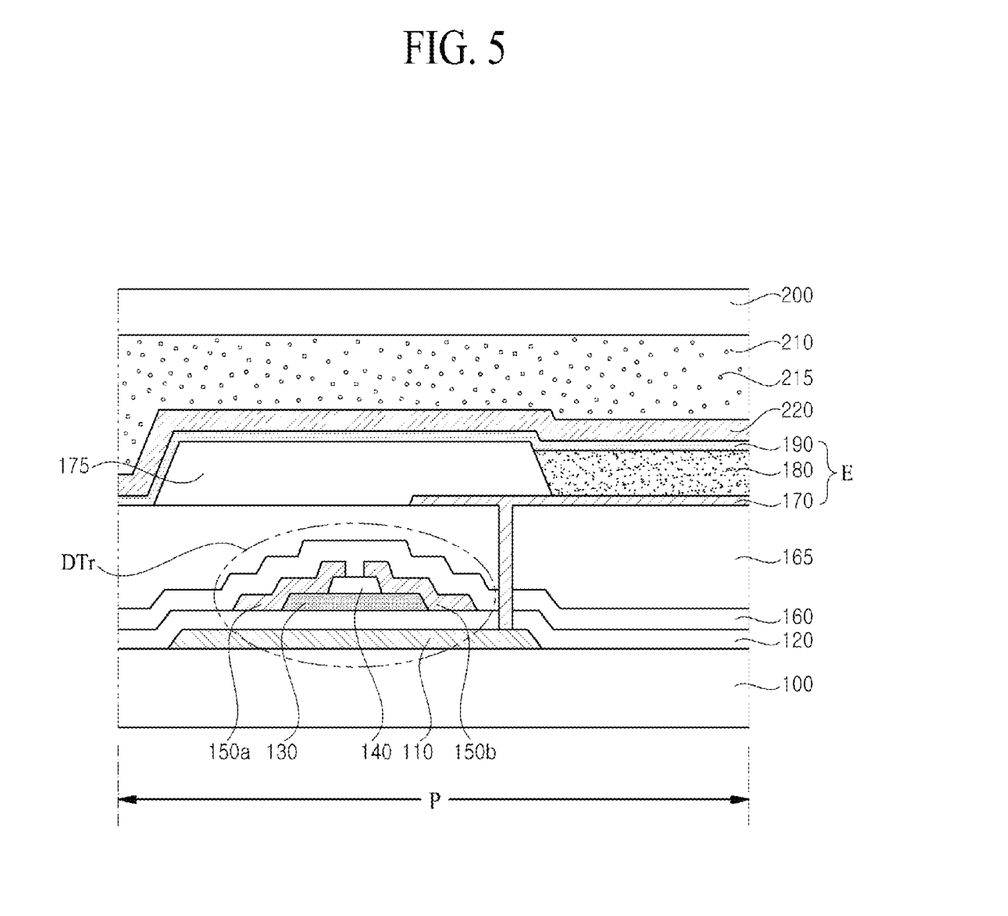
FIG. 5 is a cross-sectional view briefly illustrating an organic light emitting display device according to the third embodiment of the present invention.

However, as described above, water may be prevented from being externally permeated into the organic light emitting display device by only the viscosity layer 210, the first adhesion layer 220, or the second adhesion layer 230. Accordingly, for a thin type organic light emitting display device, the organic light emitting display device according to the third embodiment may be provided in such a manner that the second passivation layer 195 is omitted from the organic light emitting display device according to the first embodiment as shown in FIG. 5.

Figure 6:
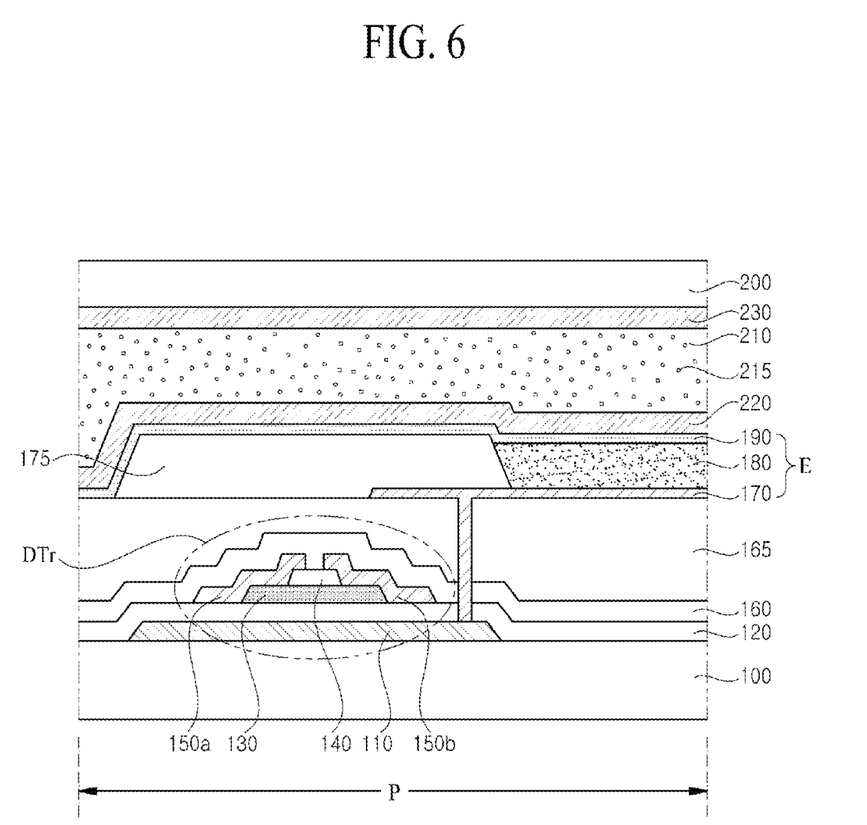
FIG. 6 is a cross-sectional view briefly illustrating an organic light emitting display device according to the fourth embodiment of the present invention.

Also, for a thin type organic light emitting display device, the organic light emitting display device according to the fourth embodiment may be provided in such a manner that the second passivation layer 195 is omitted from the organic light emitting display device according to the fourth embodiment as shown in FIG. 6.

Method for Manufacturing Organic Light Emitting Display Device

Hereinafter, a method for manufacturing an organic light emitting display device according to the present invention will be described in detail.

First Embodiment

Figure 7A:
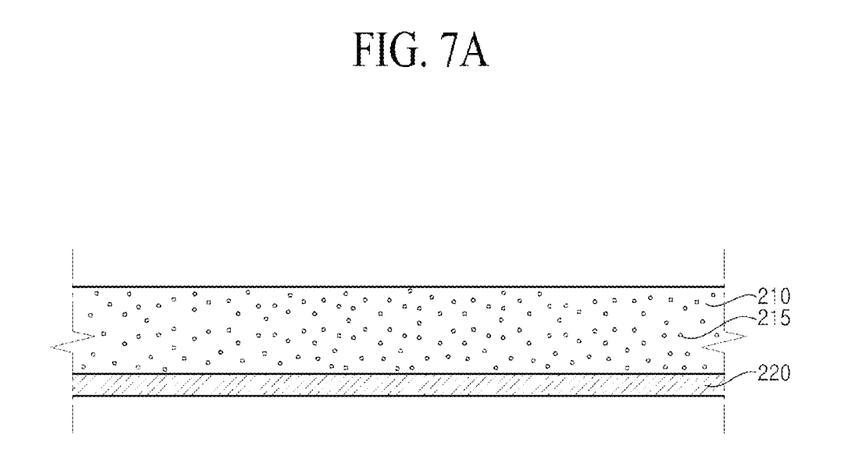
FIGS. 7A to 7C are cross-sectional views briefly illustrating manufacturing process steps of an organic light emitting display device according to the first embodiment of the present invention.
Figure 7B:
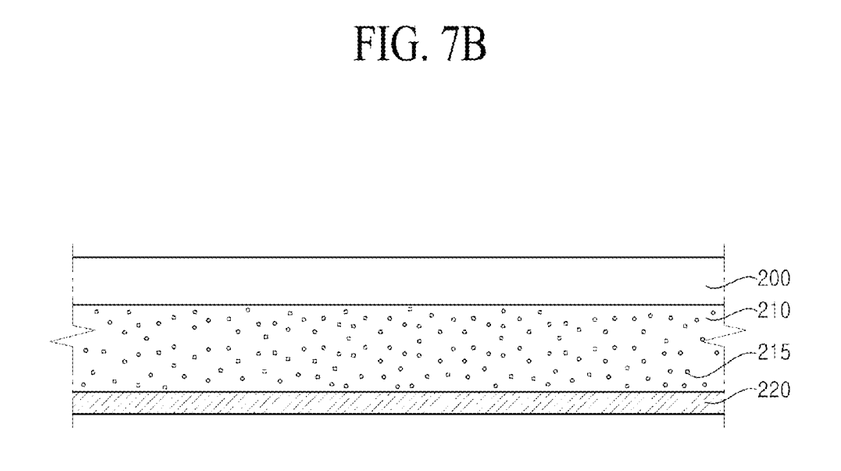
Figure 7C:
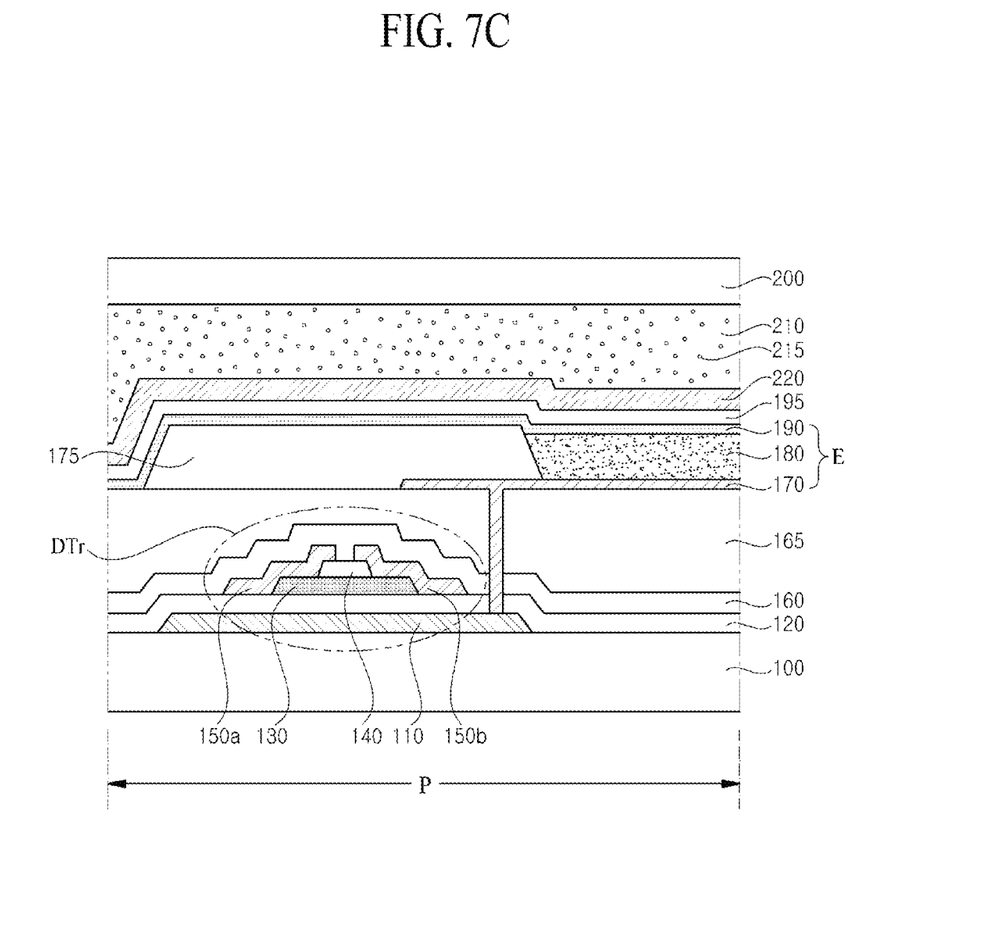

FIGS. 7A to 7C are cross-sectional views briefly illustrating manufacturing process steps of an organic light emitting display device according to the first embodiment of the present invention, and relates to a manufacturing process of an organic light emitting display device according to FIG. 3.

As shown in FIG. 7A, the viscosity layer 210 and the first adhesion layer 220 are adhered to each other. In one embodiment, the viscosity layer 210 and the first adhesion layer 220 may be adhered to each other by a laminating method. The viscosity layer 210 and the first adhesion layer 220 are preferably formed at a size that may cover the entire areas of the first substrate 100 and the second substrate 200 to shield water externally permeated thereinto, and the viscosity layer 210 includes the filler 215 for water absorption.

The viscosity layer 210 may be formed of a material having viscosity characteristic at room temperature with a cross-linkage functional group. To this end, the viscosity layer 210 may be formed of a material having storage elastic modulus of 0.001 MPa to 100 MPa in the temperature range of 20° C. to 120° C. or a material having a glass transition temperature Tg of −70° C. to 10° C. For example, the viscosity layer 210 may be formed using a polyolefin based material or polyolefin based polymer, such as Polyethylene (PE), Polypropylene (PP), Ethylene vinylacetate (EVA), and Ethylene-Ethylacrylate (EEA), or may be formed using Polyimide (PI), Polyamide (PA), Polyvinyl Chloride (PVC), or acrylic polymer material.

At this time, the viscosity layer 210 is formed to have a thickness of 5 μm to 100 μm.

The filler 215 included in the viscosity layer 210 may be formed using metal oxide such as $Li_2O$, $Na_2O$, BaO, CaO and MgO, and may also be formed using a metallic salt that includes sulphate such as $Li_2SO_4$, $Na_2SO_4$, $CaSO_4$, $MgSO_4$, $CoSO_4$, $Ga_2(SO_4)_3$, $Ti(SO_4)_2$ or $NiSO_4$, metal halide such as $CaCl_2$, $MgCl_2$, $SrCl_2$, $YCl_3$, $CuCl_2$, CsF, $TaF_5$, $NbF_5$, LiBr, $CaBr_2$, $CeBr_3$, $SeBr_4$, $VBr_3$, $MgBr_2$, $BaI_2$ or $MgI_2$, or metal chlorate such as $Ba(ClO_4)_2$ or $Mg(ClO_4)_2$.

At this time, the content of the filler 215 may be 10% to 100% by weight.

The first adhesion layer 220 may be formed of a hardening resin that includes a hardening functional group. At this time, the hardening resin may be a thermohardening resin, an optical hardening resin, or a dual hardening resin, and the hardening functional group may be one or more of an isocyanate group, a hydroxyl group, a carboxyl group, an amide group, an epoxide group, a cyclic ether group, a sulfide group, an acetal group, and a lactone group.

The first adhesion layer 220 may be formed to have a thickness of 2 μm to 20 μm. In one embodiment, the first adhesion layer 220 may also include the filler 215 to better prevent external water permeation from occurring. In this case, the first adhesion layer 220 preferably includes the filler 215 of which content is less than 20%.

Next, as shown in FIG. 7B, an opposite surface (hereinafter, referred to as 'second surface') of a surface (hereinafter, referred to as 'first surface') of the viscosity layer 210 adhered to the first adhesion layer 220 is adhered to the second substrate 200. In one embodiment, the second surface of the adhesion layer 210 may be adhered to the second substrate 200 by using the laminating method.

In one embodiment, the second substrate 200 may be formed of a metal material including Mg. In the present invention, since Mg may serve to radiate heat due to its good heat conductivity, a radiator such as a fan or a heat pipe is not required for radiation of the organic light emitting display device, whereby the lightweight and thin organic light emitting display device may be obtained more easily. For this reason, the second substrate 200 is formed of a metal material including Mg.

According to this embodiment, a metal oxide layer (not shown) may be formed on one surface of the second substrate 200 to uniformly oxidize the second substrate 200. At this time, the metal oxide layer may be formed by anodizing one surface of the second substrate 200.

Next, an opposite surface (hereinafter, referred to as 'second surface') of a surface (hereinafter, referred to as 'first surface') of the first adhesion layer 220 adhered to the viscosity layer 210 is adhered to the first substrate 100 on which the organic light emitting diode E and the driving device DTr covered by the first passivation layer 195 are formed, whereby the first substrate 100 and the second substrate 200 are bonded to each other.

In this case, since the driving device DTr and the organic light emitting diode E may be formed in accordance with a general process of forming a thin film transistor and a general process of forming an organic light emitting diode, their detailed formation processes will be omitted.

As described above, since the filler 215 for water absorption is included in the viscosity layer 210 formed of the material having viscosity characteristic at room temperature with a cross-linkage functional group and the viscosity layer 210 is interposed entirely between the first substrate 100 and the second substrate 200, it is possible to prevent water from being externally permeated into the organic light emitting display device. Since the viscosity layer 210 may endure stress caused by increase of the volume of the filler, separation between the viscosity layer 210 and the first substrate 100 and between the viscosity layer 210 and the second substrate 200 may be prevented from occurring. Also, since separation between the first substrate 100 and the viscosity layer 210 and between the second substrate 200 and the viscosity layer 210 may be prevented from occurring, water permeation into the separation area does not occur, whereby the organic light emitting diode E and the second passivation layer 195, which passivates the organic light emitting diode E, may be prevented from being damaged.

Although it has been described that the organic light emitting diode E and the driving device DTr are surrounded by the second passivation layer 195 in FIG. 7C, the process of forming the second passivation layer 195 may be omitted for the thin type organic light emitting display device in the modified embodiment.

Second Embodiment

Figure 8A:
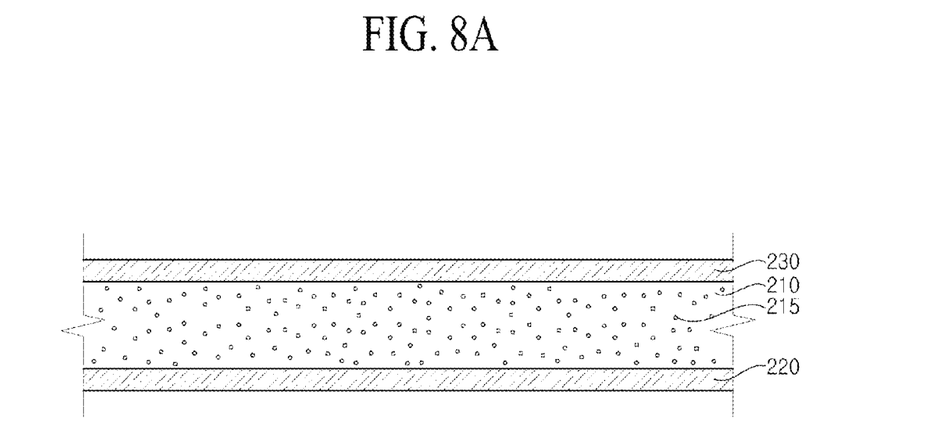
FIGS. 8A to 8C are cross-sectional views briefly illustrating manufacturing process steps of an organic light emitting display device according to the second embodiment of the present invention.
Figure 8B:
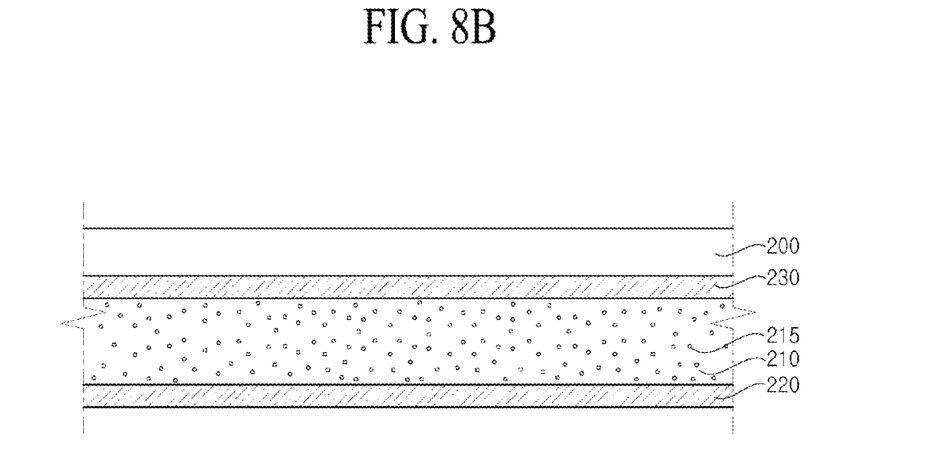
Figure 8C:
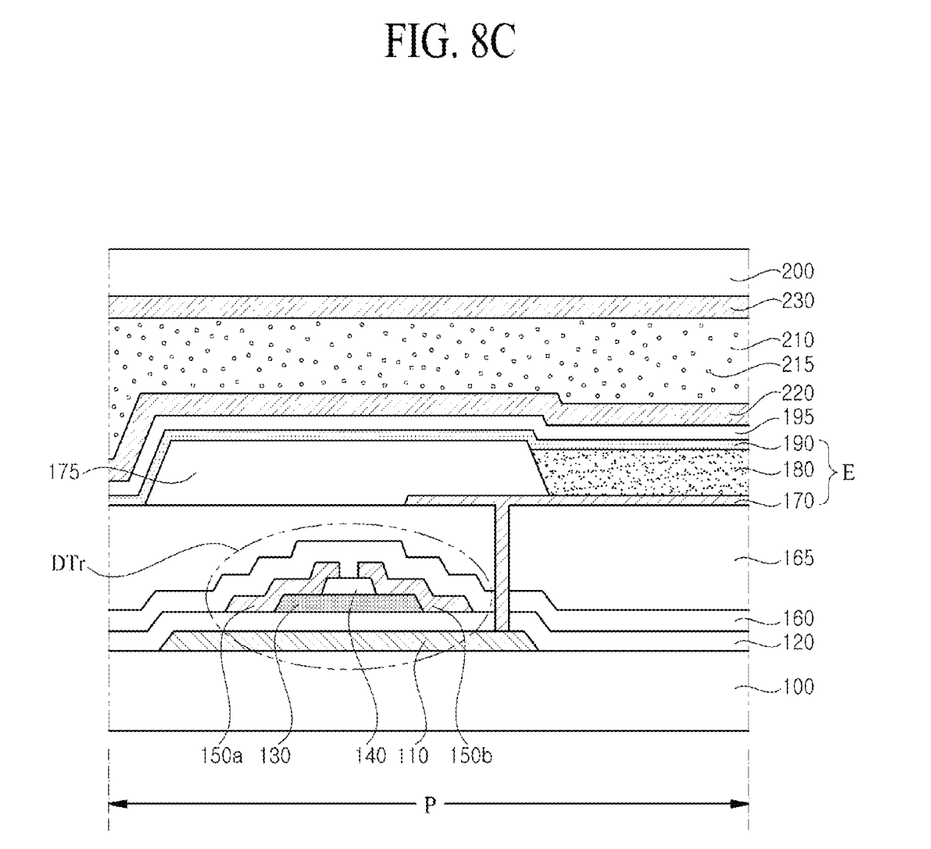

FIGS. 8A to 8C are cross-sectional views briefly illustrating manufacturing process steps of an organic light emitting display device according to a second embodiment of the present invention, and relates to a manufacturing process of an organic light emitting display device according to FIG. 4.

As shown in FIG. 8A, the first adhesion layer 220, the viscosity layer 210, and the second adhesion layer 230 are sequentially adhered to one another. In one embodiment, the first adhesion layer 220, the viscosity layer 210, and the second adhesion layer 230 may be adhered to one another by a laminating method. At this time, the viscosity layer 210, the first adhesion layer 220, and the second adhesion layer 230 are preferably formed at a size that may cover the entire areas of the first substrate 100 and the second substrate 200 to shield water from externally permeated thereinto.

The viscosity layer 210 and the first adhesion layer 220 are the same as those described in the first embodiment, and the second adhesion layer 230 may be formed in the same manner as the first adhesion layer 220. Accordingly, a detailed description of the viscosity layer 210, the first adhesion layer 220, and the second adhesion layer 230 will be omitted.

Next, as shown in FIG. 8B, a surface opposite (hereinafter, referred to as 'second surface') a surface (hereinafter, referred to as 'first surface') of the second adhesion layer 230 that is adhered to the viscosity layer 210 is adhered to the second substrate 200. In one embodiment, the second surface of the second adhesion layer 230 may be adhered to the second substrate 200 by using the laminating method.

Since the second substrate 200 is the same as that of the first embodiment, its detailed description will be omitted.

Next, as shown in FIG. 8C, a second surface of the first adhesion layer 220 is adhered to the first substrate 100 on which the organic light emitting diode E and the driving device DTr covered by the first passivation layer 195 are formed, whereby the first substrate 100 and the second substrate 200 are bonded to each other.

In this case, since the driving device DTr and the organic light emitting diode E may be formed in accordance with a general process of forming a thin film transistor and a general process of forming an organic light emitting diode, their detailed formation processes will be omitted.

As described above, since the organic light emitting display device manufactured in accordance with the second embodiment includes the second adhesion layer 230 for adhering the viscosity layer 220 to the second substrate 200, adhesion between the viscosity layer 220 and the second substrate 200 is improved compared to the organic light emitting display device manufactured in accordance with the first embodiment. As a result, separation between the second substrate 200 and the viscosity layer 210 may effectively be prevented from occurring, whereby water permeation caused by separation is shielded.

Although it has been described that the organic light emitting diode E and the driving device DTr are surrounded by the second passivation layer 195 in FIG. 8C, the process of forming the second passivation layer 195 may be omitted for the thin type organic light emitting display device in a modified embodiment.

According to the present invention, the below advantages may be obtained.

Since the viscosity layer, which includes the filler for water absorption, is interposed for the entire area between the first substrate and the second substrate, water may be prevented from externally permeating into the organic light emitting display device.

Also, since the filler for water absorption is included in the viscosity layer having no hardening functional group, even though the volume of the filler is increased due to water absorption, stress of the viscosity layer is reduced, whereby separation between the viscosity layer and the first substrate and between the viscosity layer and the second substrate may be prevented from occurring.

Also, since separation between the first substrate and the viscosity layer and between the second substrate and the viscosity layer may be prevented from occurring, water permeation caused by the separation may be shielded, whereby the organic light emitting diode and the second passivation layer, which passivates the organic light emitting diode, may be prevented from being damaged.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing an organic light emitting display device, the method comprising:
   forming an organic light emitting diode and a driving device to drive the organic light emitting diode on a first substrate;
   forming a passivation layer on the organic light emitting diode;
   adhering a lower surface of a viscosity layer, which includes a filler capable of water absorption and has a viscosity characteristic at room temperature with a cross-linkage functional group, to an upper surface of a first adhesion layer;
   adhering an upper surface of the viscosity layer to a lower surface of a second adhesion layer;
   adhering an upper surface of the second adhesion layer to a lower surface of a second substrate facing the first substrate; and
   bonding the first substrate and the second substrate to each other by adhering a lower surface of the first adhesion layer to an upper surface of the passivation.

2. The method of claim 1, wherein the viscosity layer is a material having a storage elastic modulus of 0.001 MPa to 100 MPa in the range of 20° C. to 120° C.

3. The method of claim 1, wherein the viscosity layer is a material having a glass transition temperature Tg of −70° C. to 10° C.

4. The method of claim 1, wherein the viscosity layer is a polyolefin based material, Polyimide (PI), Polyamide (PA), Polyvinyl Chloride (PVC), or acrylic polymer material.

5. The method of claim 1, wherein the filler is a water reactive absorbent made of a single or two or more mixtures of a metal powder, a metal oxide, metallic salt material, or Phosphorus Pentoxide (P2O5).

6. The method of claim 1, wherein the filler is a physical absorbent made of silica, zeolite, titania, zirconia, or montmorillonite.

7. The method of claim 1, wherein a content of the filler in the viscosity layer is 10% to 100% by weight.

8. The method of claim 1, wherein a thickness rate of the first adhesion layer and the viscosity layer is 0.1 to 1.5.

9. The method of claim 1, wherein the first adhesion layer as a thickness of 2 μm to 20 μm, and the viscosity layer has a thickness of 5 μm to 100 μm.

10. The method of claim 1, wherein the second substrate is formed of a metal material including Mg.

11. A method for manufacturing an organic light emitting display device, the method comprising:
    forming an organic light emitting diode and a driving device to drive the organic light emitting diode on a first substrate;
    adhering a lower surface of a viscosity layer, which includes a filler capable of water absorption and has a viscosity characteristic at room temperature with a cross-linkage functional group, to an upper surface of a first adhesion layer;
    adhering an upper surface of the viscosity layer to a lower surface of a second adhesion layer;
    adhering an upper surface of the second adhesion layer to a lower surface of a second substrate facing the first substrate; and
    bonding the first substrate and the second substrate to each other by adhering a lower surface of the first adhesion layer to the organic light emitting diode.

12. The method of claim 11, wherein the viscosity layer is a material having a storage elastic modulus of 0.001 MPa to 100 MPa in the range of 20° C. to 120° C.

13. The method of claim 11, wherein the viscosity layer is a material having a glass transition temperature Tg of −70° C. to 10° C.

14. The method of claim 11, wherein the viscosity layer is a polyolefin based material, Polyimide (PI), Polyamide (PA), Polyvinyl Chloride (PVC), or acrylic polymer material.

15. The method of claim 11, wherein the filler is a water reactive absorbent made of a single or two or more mixtures of a metal powder, a metal oxide, metallic salt material, or Phosphorus Pentoxide ($P_2O_5$).

16. The method of claim 11, wherein the filler is a physical absorbent made of silica, zeolite, titania, zirconia, or montmorillonite.

17. The method of claim 11, wherein a content of the filler in the viscosity layer is 10% to 100% by weight.

18. The method of claim 11, wherein a thickness rate of the first adhesion layer and the viscosity layer is 0.1 to 1.5.

19. The method of claim 11, wherein the first adhesion layer as a thickness of 2 μm to 20 μm, and the viscosity layer has a thickness of 5 μm to 100 μm.

20. The method of claim 11, wherein the second substrate is formed of a metal material including Mg.

* * * * *